United States Patent [19]
Valdettaro

[11] 3,931,743
[45] Jan. 13, 1976

[54] COMPACT SPEED REDUCTION MECHANISM FOR A UHF INDICATOR DIAL

[75] Inventor: Alarico A. Valdettaro, Bloomington, Ind.

[73] Assignee: Sarkes Tarzian, Inc., Bloomington, Ind.

[22] Filed: Nov. 20, 1974

[21] Appl. No.: 525,354

[52] U.S. Cl. .............. 74/10.54; 74/10.52; 74/10.8; 74/804
[51] Int. Cl.² ........................................ F16H 35/18
[58] Field of Search............ 74/10.54, 10.52, 10.50, 74/10.8, 804

[56] References Cited
UNITED STATES PATENTS

| | | | |
|---|---|---|---|
| 2,968,958 | 1/1961 | Kennedy et al. | 74/824 |
| 3,214,984 | 11/1965 | Wallbreck et al. | 74/10.54 |
| 3,385,116 | 5/1968 | Carlson et al. | 74/10.54 |
| 3,444,760 | 5/1969 | Claxton et al. | 74/10.54 |
| 3,447,385 | 6/1969 | Humphreys | 74/10.52 |
| 3,496,782 | 2/1970 | Carlson et al. | 74/10.52 |
| 3,844,176 | 6/1974 | Valdettaro | 74/10.54 |

*Primary Examiner*—Samuel Scott
*Assistant Examiner*—Randall Heald
*Attorney, Agent, or Firm*—Mason, Kolehmainen, Rathburn & Wyss

[57] ABSTRACT

A compact speed reduction mechanism for driving a tuning indicator dial of a UHF television tuner or the like includes a harmonic drive unit having a rigid fixed spline and a movable flexible spline member. The indicator dial is mechanically coupled to the flexible spline member and a wave generator is attached to the selector shaft. The number of teeth on each spline is selected to give approximately a 7:1 reduction ratio between the selector shaft and the indicator dial. More teeth are provided on the flexible spline than the rigid spline to prevent binding between the splines which normally occurs when reduction ratios of less than approximately 20:1 are used.

11 Claims, 5 Drawing Figures

U.S. Patent  Jan. 13, 1976  3,931,743
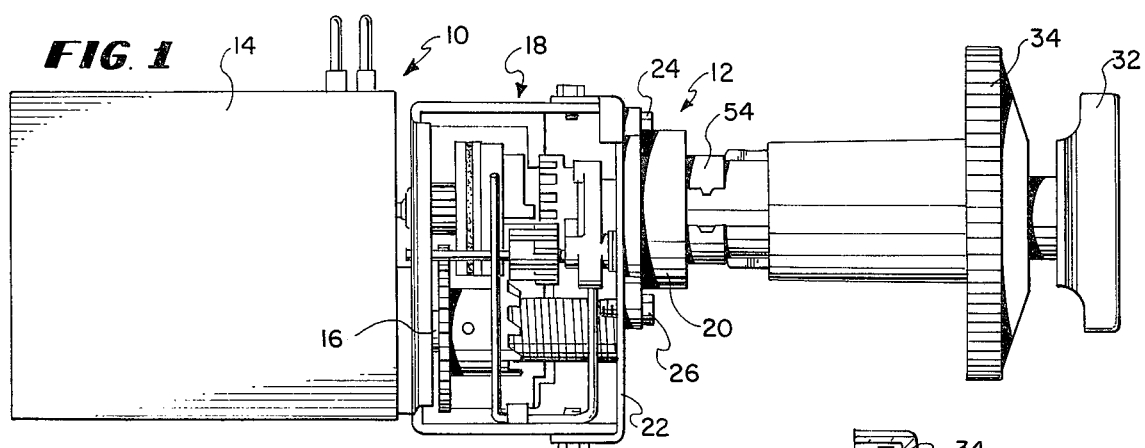
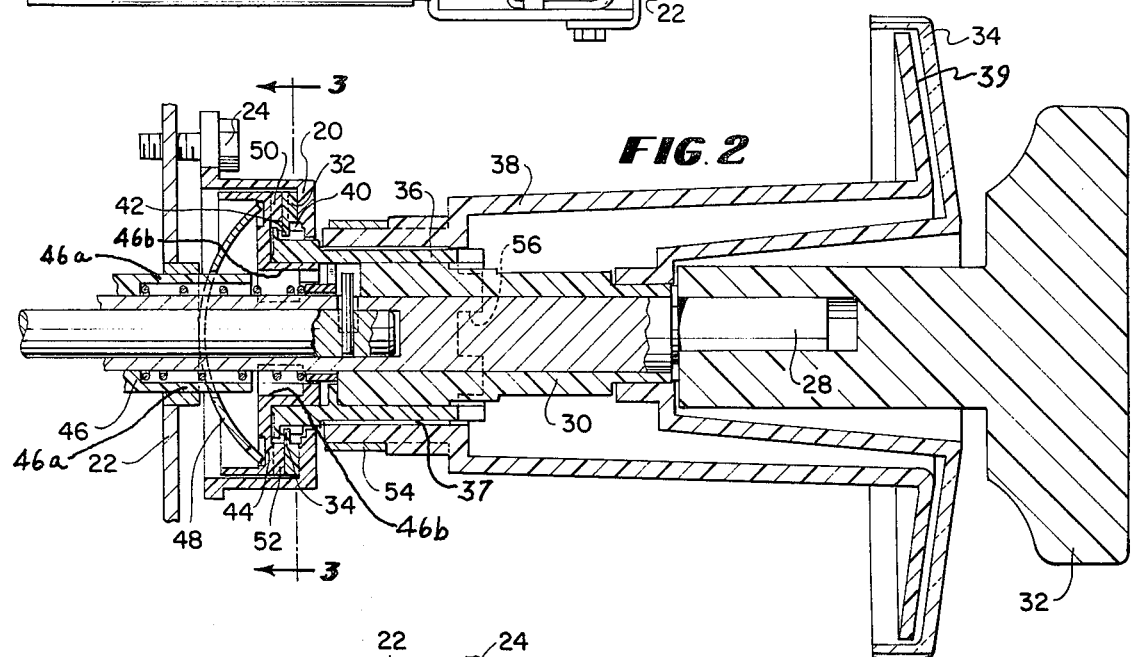
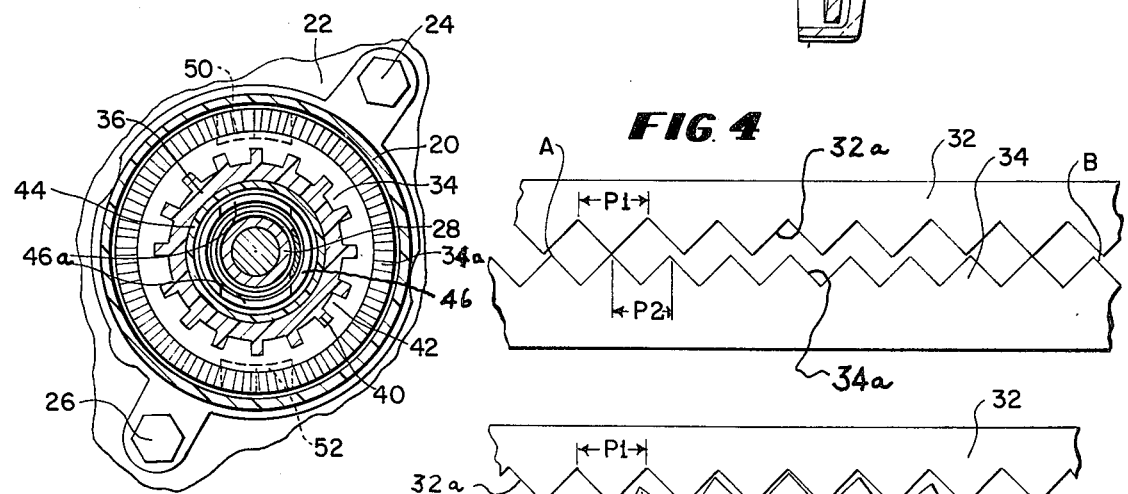
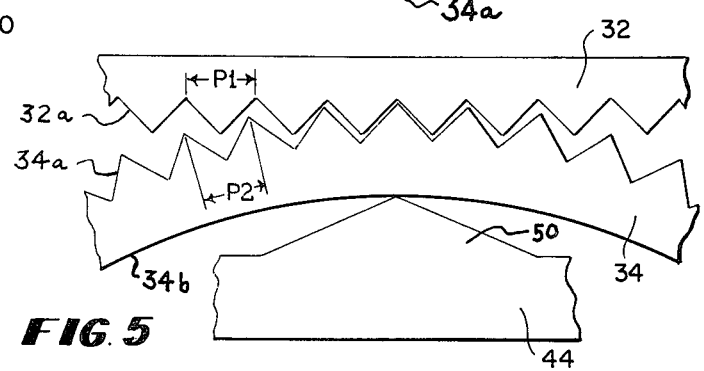

COMPACT SPEED REDUCTION MECHANISM FOR A UHF INDICATOR DIAL

BACKGROUND OF THE INVENTION

1. Field of the Invention

This invention relates generally to speed reduction systems and, more particularly, to compact speed reduction systems usable for driving the tuning indicator dial of a UHF tuner.

2. Description of the Prior Art

Modern UHF television tuners generally employ a continuously variable tuning mechanism driven by a multiple turn detented selector shaft. The selector shaft of modern UHF tuners is generally rotatable over a range of approximately 7 revolutions to cover the seventy UHF channels, each revolution of the selector shaft covering 10 of the 70 channels. One form of tuning indicator which is used with UHF tuners of this type is rotatable over only 1 revolution, thereby requiring a speed reduction mechanism between the selector shaft and the tuning indicator dial.

Several speed reduction mechanisms for driving an indicator dial are known. These mechanisms generally employ a plurality of gears to achieve the desired speed reduction. Although these mechanisms provide a way to realize the necessary speed reduction, gear mechanisms are generally expensive and difficult to fabricate, tend to be bulky, and the play normally occurring between the gears can result in an erroneous indication by the indicator dial. The bulk of gear mechanisms is particularly objectionable in compact portable television sets where space is at a premium, thereby making it difficult to fabricate a satisfactory dial drive mechanism.

Flexible spline speed reduction mechanisms provide a compact speed reduction mechanism that avoids the problems of most other drive systems. For this reason, they have been used as speed reduction mechanisms for fine tuning UHF television tuners. However, flexible spline speed reduction mechanisms tend to bind with reduction ratios of much less than approximately 20-to-1 (the ratio used in fine tuning systems) are employed, and have been considered unsuitable for dial drive mechanisms where a 7-to-1 ratio is required.

SUMMARY OF THE INVENTION

Accordingly, it is an object of the present invention to provide a novel, compact drive mechanism for a tuning indicator dial for a UHF tuner.

It is another object of the present invention to provide a flexible spline speed reduction mechanism that does not bind at low speed reduction ratios on the order of 7-to-1.

It is a further object of the present invention to provide a tuning indicator dial assembly for a UHF television set that may be readily adjusted for tracking from outside of the set.

In accordance with the preferred embodiment of the invention, a rigid spline having a plurality of teeth is fixedly attached to the tuner housing. A rotatable flexible spline member having finer teeth than the rigid fixed spline is urged into engagement with the fixed spline by a rotatable wave generator. The wave generator is coupled to the selector shaft, and the rotatable spline is mechanically coupled to the tuning indicator dial. Rotation of the selector shaft causes the wave generator to impart wave motion to the flexible spline, thereby causing the indicator dial to rotate at a lower speed determined by the difference in the number of teeth in the rigid and flexible splines. By utilizing finer teeth in the flexible spline, the teeth of the flexible spline are deformed by the wave generator to match the coarser teeth of the fixed spline, thereby eliminating the binding that normally occurs when low reduction ratios are used.

The invention, both as to its organization and method of operation, together with further objects and advantages thereof, will best be understood by reference to the following specification taken in connection with the accompanying drawing in which:

FIG. 1 is a side elevational view of a UHF television tuner utilizing the dial drive mechanism according to the invention;

FIG. 2 is a side cross-sectional view of the dial drive mechanism according to the invention shown on a somewhat larger scale and showing the selector shaft and the indicator dial;

FIG. 3 is a front cross-sectional view of the dial drive mechanism according to the invention taken along line 3—3 of FIG. 2;

FIG. 4 is a detailed side view of the rigid and flexible splines shown in FIGS. 2 and 3 illustrating the relative position of the teeth of the rigid and flexible splines with the flexible spline undeformed; and FIG. 5 shows the relative position of the teeth of the rigid and flexible splines when the flexible spline is deformed by the wave generator.

Referring now to the drawing, there is shown a detented UHF tuning system generally designated as 10 employing the dial drive mechanism 12 according to the invention. The detented tuning mechanism 10 comprises a standard UHF television tuner 14 having a continuously variable tuning shaft 16 coupled to a 70 position detented tuner driving mechanism 18. The detented tuner driving mechanism 18 is more fully described in the Valdettaro U.S. Pat. No. 3,774,459 assigned to the same assignee as the assignee of the present invention and incorporated herein by reference.

The dial driving mechanism 12 includes a housing 20 that is affixed to the front housing 22 of the tuner driving mechanism 18 by means of a pair of screws 24 and 26. The housing 20 is mounted concentrically with a selector shaft 28 and a fine tuning shaft 30 extending from the tuner driving mechanism 18. A selector knob 32 and a fine tuning knob 34 are affixed to the selector shaft 28 and the fine shaft 30, respectively.

A rigid annular spline portion 32, having a plurality of rearwardly facing radially extending teeth 32a, is molded in the inner surface of the housing 20 in coaxial relationship with the fine tuning shaft 30 and the selector shaft 28. A flexible annular spline member 34 is positioned opposite the rigid spline 32 by an indicator dial driving collar 36 which is concentrically mounted with the fine tuning shaft 30. The flexible spline member 34 is provided with an annular series of radially extending forwardly facing teeth 34a (FIG. 4) opposite the teeth 32a. An indicator dial 38 is affixed to the dial driving collar 36 for rotation therewith, and a spline 40 molded into the collar 36 engages a spline 42 formed into the flexible spline member 34 to prevent relative rotation between the collar 36 and the flexible spline member 34.

A wave generator 44 is disposed about the selector shaft 28, and rotory motion is transferred from the selector shaft 28 to the wave generator 44 by means of a driving spline 46 affixed to the selector shaft 28. The driving spline 46 has a pair of forwardly extending members 46a which engage a pair of recesses 46b in the wave generator 44. The members 46a and recesses 46b are shown in a disengaged condition for purposes of clarity in FIG. 2; however, in an operative system, the screw 24 would be tightened sufficiently to bring the housing 20 into physical contact with the front housing 22, thereby bringing the members 46a into engagement with the recesses 46b. A curved annular biasing spring 48 is employed to resiliently bias the wave generator 44 against the flexible spline member 34 to maintain the flexible spline member 34 in engagement with the rigid spline 32 at two diametrically opposed points beneath a pair of triangular forwardly facing members 50 and 52 formed on the wave generator 44.

The indicator dial 38 is provided with a plurality of numbers in the annular dial area 39 thereof corresponding to the UHF channel numbers 14-83. The fine tuning knob 34 is fabricated from a clear plastic or the like to permit the viewing of the channel numbers therethrough. A pointer or other reference mark (not shown) is disposed on the television cabinet adjacent to the indicator dial to provide an indication of the channel being received. Alternatively, the numbers can be disposed on the television cabinet and the reference mark can be affixed to the indicator dial. The channel numbers are generally disposed about 360°, or less, of the dial, and the indicator dial is incrementally advanced each time the selector knob 32 is moved one detent position. As a result, an indication of each of the channels in the UHF band is provided over a range of rotation of less than one revolution of the indicator dial 38.

In order to provide an accurate indication of the channel being received, the indicator dial 38 must be accurately positioned with respect to a stationary reference mark. To provide for the adjustment of the indicator dial 38 with respect to the stationary reference mark, a series of castellations 56 are formed in the end of the collar 36. These castellations are engageable by a special tool having similar castellations. Adjustment of the indicator dial is done by holding the collar 36 in place with the special tool while rotating the indicator dial 38 to the desired position. The special tool prevents the adjusting torque applied to the indicator dial 38 from possibly damaging the reduction mechanism 12 or causing slippage between the splines 32 and 34.

The collar 36 and the dial 38 may be provided with a pair of mating splines 37 (FIG. 2), or one or both of the mating surfaces may be smooth. In the event that the mating spline 37 is used, the splines must be fine enough to provide the necessary accuracy of adjustment. If these splines 37 are too coarse, the incremental rotation of the dial as the spline 37 slips from one tooth to the next will be too large to provide an accurate adjustment of the dial 38. For this reason, slippage within the reduction mechanism 12 is not used to provide the vernier adjustment of the dial. If the teeth 32a and 34a of the splines 32 and 34, respectively, are made fine enough to provide the necessary accuracy of adjustment, it is possible that undesired slippage between the two splines will occur during normal tuning of the set. If the teeth are made coarser, the incremental rotation of the dial 38 during slippage is too great to provide the accurate adjustment. For this reason, the splines 32 and 34 are provided with relatively coarse teeth 32a and 34a, respectively, to prevent slippage and the vernier adjustment of the tuning knob 38 is accomplished by relative rotation between the collar 36 and the dial 38.

The selector shaft 28 has a range of rotation of approximately seven turns to cover the entire UHF television band whereas the indicator dial 38 requires less than one turn to cover this band. The speed reduction mechanism 12 provides the necessary speed reduction between the selector knob 32 and the indicator dial 38 as follows. Rotation of the selector shaft 28 causes a corresponding rotation of the wave generator 44. The members 50 and 52, which are disposed about the periphery of the wave generator 44 at 180° intervals, engage the back side of the flexible spline member 34 to bring opposed points thereon into engagement with the rigid spline 32 in the regions beneath the members 50 and 52. As the wave generator 44 is rotated, the members 50 and 52 slide along the rear surface 34b (FIG. 5) of the spline member 34 and successively bring each of the teeth 34a of the flexible spline member 34 into engagement with a corresponding valley between the teeth 32a in the rigid spline 32. Because spline members 32 and 34 contain unequal numbers of teeth, the pitch of the teeth in the two spline members is unequal, and the engagement of successive teeth requires the repositioning of the two splines by an amount equal to the difference in pitch of the teeth of the two splines. As a result, the flexible spline member 34 gradually rotates with respect to the fixed rigid spline 32 as the selector knob 32 is rotated. The number of teeth 34a in the flexible spline member 34 is greater than the number of teeth 32a in the fixed rigid spline 32. As a result, the flexible spline 34 rotates in the same direction as the selector knob 32.

The rotation of the flexible spline member 34 is imparted to the collar 36 by means of the splines 40 and 42 interconnecting the flexible spline member 34 and the collar 36. The indicator dial 38 is affixed to the collar 36 by means of retaining spring 54 and rotates with the collar 36 as the selector knob 32 is rotated.

In accordance with an important feature of the present invention, the flexible spline member 34 is provided with relatively more teeth than the rigid spline 32 to prevent jamming of the speed reduction mechanism when relatively low reduction ratios are used. For example, in the embodiment shown in the Figures, the rigid spline 32 is provided with 40 teeth 32a and the flexible spline member 34 is provided with 46 teeth 34a to provide a reduction ratio of approximately 7-to-1. The absolute number of teeth provided may be varied to suit the particular application, and in general, in order to provide a 7-to-1 reduction ratio, the number of teeth in the flexible spline member 34 should exceed the number of teeth in the rigid spline 32 by approximately one-seventh of the number of teeth in the rigid spline 32.

The reason for the improved performance is best illustrated in FIGS. 4 and 5. In flexible spline drive systems, relative motion between the two splines is achieved by providing a different number of teeth in each of the splines. As a result, the pitch of spacing between the peaks or valleys of the teeth of the two splines is unequal. For example, in the embodiment shown in FIG. 4, the rigid spline 32 has a pitch equal to P1 and the flexible spline member 34 has a pitch P2 that is shorter than the pitch P1. The difference between the pitches P1 and P2 is dependent upon the relative number of teeth in each of the spline members 32 and 34, and hence on the reduction ratio of the spline drive unit.

Most spline drive reduction mechanisms presently being produced have a relatively high reduction ratio on the order of 20-to-1 or more. As a result, the pitches of the rigid and flexible splines are only slightly different. However, when the reduction ratio is reduced substantially below 20-to-1, the pitches of the rigid and flexible splines become unequal to cause jamming of the reduction mechanism.

In a spline drive mechanism, the relative motion of the two spline members is caused by a gradual slipping of the splines with respect to each other as a wave generator successively forces the peaks of adjacent teeth of one spline into corresponding valleys in the other spline. Because of the difference in the pitch of the two splines, a realignment of the splines must occur each time a successive peak is forced into a respective valley of the opposite spline.

However, when the difference between the two pitches is excessive, a situation can arise wherein the direction of relative motion is not uniquely defined and jamming of the splines can result. For example, if pressure is applied to force the splines 32 and 34 together near point A (FIG. 4), the resulting force will cause the spline 34 to slide to the right with respect to the spline 32. Conversely, if a force is applied to the two splines to bring them into engagement near point B, the spline 34 will slide to the left with respect to the spline 32. As a result, the direction of motion is determined by the point at which the engaging pressure is applied rather than the relative pitch of the two splines. Furthermore, because the engaging members of practical wave generators have a finite width, and because the distance between the points A and B is relatively close for low ratio reduction mechanisms, some force will be applied to both points A and B thereby resulting in a jamming of the reduction mechanism unless special precautions are taken.

The jamming problems described in the foregoing can be largely eliminated if the larger number of teeth is provided on the flexible spline and if means are provided for preventing the engagement of teeth remotely positioned from the point of engagement of the two splines. The latter function is provided by making the teeth of both of the splines relatively fine or by making one of the splines sufficiently flexible to permit the teeth thereof to clear the teeth of the rigid spline except at the point of engagement of the two splines. This is best illustrated in FIG. 5 which shows the splines 32 and 34 near the region of contact therebetween. As the flexible spline 34 is forced into engagement with the rigid spline 32 by the portion 50 of the wave generator 44, the flexible spline 34 is bent in the region of contact so that the peaks of the teeth of the flexible spline 34 are spread apart to make the pitch P2 appear to be substantially equal to the pitch P1. This prevents the overlapping of teeth such as that occurring at points A and B of FIG. 4, and prevents jamming when low reduction ratios are used. Furthermore, the flexible spline 34 is made of relatively flexible material so as to bring the splines 32 and 34 out of engagement as soon as possible in the area away from the point of contact. As a result, a sufficiently low reduction ratio to make a flexible spline drive mechanism usable for driving an indicator dial for a UHF television tuner can be achieved.

While certain preferred embodiments of the invention have been described by way of illustration, many modifications will occur to those skilled in the art; it will be understood, of course, that it is not desired that the invention be limited thereto, since modifications may be made, and it is, therefore, contemplated by the appended claims to cover any such modifications as fall within the true scope and spirit of the invention.

What is claimed as new and desired to be secured by Letters Patent of the United States is:

1. A tuning system comprising:
    a tuner having a selector shaft, rotation of which is effective to tune said tuner over a predetermined band of frequencies, a plurality of revolutions of said selector shaft being required to tune said tuner over said predetermined band;
    a rotatable tuning indicator;
    means interconnecting said selector shaft and said tuning indicator, said interconnecting means including
    a circular rigid spline member fixedly attached to said tuner, said rigid spline member having a first plurality of teeth circularly disposed on a radially extending surface of said rigid spline member,
    a circular flexible spline member having a second plurality of teeth greater in number than said first plurality of teeth circularly disposed on a radially extending surface of said flexible spline member and opposing said first plurality of teeth,
    a wave generating member engaging said flexible spline member, said wave generating member being biased to urge at least one of said second plurality of teeth into engagement with one of said first plurality of teeth, said wave generating member being affixed to said selector shaft for rotation therewith to thereby successively bring different ones of said first and second pluralities of teeth into engagement thereby causing said flexible spline member to rotate at a predetermined rate slower than the rotation of said selector shaft, and
    means mechanically coupling said flexible spline member to said tuning indicator dial for causing said tuning indicator dial to rotate in synchronism with said flexible spline member.

2. A system as recited in claim 1 wherein said rigid spline member has defined therein an aperture concentric with said first plurality of circularly disposed teeth, and said selector shaft and said coupling means extend through said aperture in coaxial relation thereto.

3. A system as recited in claim 2 wherein said rigid spline member is interposed between said flexible spline and said tuning indicator.

4. A system as recited in claim 3 wherein the number of teeth in each of said first and second plurality of teeth is in the range of approximately 40 to 50.

5. A system as recited in claim 4 wherein the number of teeth comprising said first plurality of teeth is approximately 40 and the number of teeth comprising said second plurality of teeth is approximately 46.

6. A system as recited in claim 3 wherein the number of teeth comprising said first plurality of teeth is an integer N and the number of teeth comprising said second plurality of teeth is a second integer M, where M is an integer that exceeds the integer N by an integer approximately equal to one-seventh of the value of the integer N.

7. A system as recited in claim 3 wherein said tuning indicator dial is mounted coaxially on said selector shaft.

8. A system as recited in claim 7 wherein said coupling means includes a collar engaging said flexible spline member and said tuning indicator, said collar being mounted in coaxial relationship with said selector shaft, said flexible spline member and said tuning indicator dial.

9. A system as recited in claim 8 wherein the number of teeth in each of said first and second plurality of teeth is selected to provide approximately a 7-to-1 speed reduction ratio drive to said tuning indicator dial.

10. A system as recited in claim 9 wherein the number of teeth in each of said first and second plurality of teeth is selected to cause the tuning indicator dial to rotate in the same direction as the selector shaft.

11. A system as recited in claim 8 wherein said collar includes a plurality of externally engageable castellations and said indicator dial is rotatable with respect to said collar when said collar is restrained by said castellations.

* * * * *